United States Patent [19]

Peterson et al.

[11] Patent Number: 4,611,133

[45] Date of Patent: Sep. 9, 1986

[54] HIGH SPEED FULLY PRECHARGED PROGRAMMABLE LOGIC ARRAY

[75] Inventors: Benjamin C. Peterson, Tempe, Ariz.; Yoseph L. Linde, Needham, Mass.; Yigal Brandman, Stanford, Calif.

[73] Assignee: Codex Corporation, Mansfield, Mass.

[21] Appl. No.: 493,901

[22] Filed: May 12, 1983

[51] Int. Cl.[4] .............. H03K 19/177; H03K 19/017; H03K 19/096; H03K 19/20

[52] U.S. Cl. .................... 307/465; 307/443; 307/469; 307/481

[58] Field of Search ............ 307/443, 465, 468, 469, 307/481, 449, 463; 364/716

[56] References Cited

U.S. PATENT DOCUMENTS

| | | | |
|---|---|---|---|
| 3,943,377 | 3/1976 | Suzuki | 307/469 |
| 3,974,366 | 8/1976 | Hebenstreit | 307/468 |
| 4,037,089 | 7/1977 | Horninger | 307/465 X |
| 4,291,247 | 9/1981 | Cooper, Jr. et al. | 307/443 X |
| 4,501,977 | 2/1985 | Koike | 307/469 |

OTHER PUBLICATIONS

Hebenstreit et al., "High-Speed Programmable Logic Arrays in ESFI SOS Technology", IEEE JSSC., vol. SC-11, No. 3, pp. 370-374, 6/76.

*Primary Examiner*—Larry N. Anagnos
*Attorney, Agent, or Firm*—Walter W. Nielsen; Joe E. Barbee

[57] ABSTRACT

A logic array which is small in size and low in power dissipation uses only one clock signal. The array is fully precharged by precharging a first portion and a second portion and then applying ground to the first portion while delayably applying the ground to the second portion. The address is read into the first portion during the precharging to speed up operation of the array.

4 Claims, 2 Drawing Figures

HIGH SPEED FULLY PRECHARGED PROGRAMMABLE LOGIC ARRAY

BACKGROUND OF THE INVENTION

This invention relates, in general, to arrays for performing logic functions, and more particularly, to a high speed, fully precharged programmable logic array.

Arrays for performing logic functions, typically called logic arrays or programmable logic arrays, have been used to replace random logic in many digital circuits. Such programmable logic arrays are especially useful in the control section of digital systems and are frequently thought of as read only storage, read only memories, or the such. The programmable logic array is a well known convenient way of using arrays of identical circuit elements to implement arbitrary logical functions in integrated circuits. Such arrays are typically arranged in two portions or arrays. The first array generates product of sum terms and is referred to as the AND array or plane, and the second array generates sum of product terms and is referred to as the OR array or plane. Typically in NMOS technology each of the portions consists of NOR arrays which are interconnected so that the first portion performs a logical AND function and the second portion performs a logical OR function.

When a programmable logic array is implemented on an integrated circuit it becomes desirable to reduce the size of the circuit, reduce the power consumption, and speed up the operation of the circuit. One way to reduce the power consumption of the circuit is to precharge the circuit. One such dynamic programmable logic array is shown in "High-Speed Dynamic Programmable Logic Array Chip" By R. A. Wood, in IBM Journal of Research and Development, Vol. 19, No. 4, July 1975 begining at page 379. However, there are still improvements that could be made to a programmable logic array which would make the circuit smaller, and increase the operating speed which are not disclosed in Wood's article.

Accordingly, it is an object of the present invention to provide an improved programmable logic array.

Another object of the present invention is to provide a logic array having a virtual ground that can be floated, pulled high during array precharge, and then controllably coupled to ground all with a single control signal.

Yet another object of the present invention is to provide a programmable logic array which has a sense or status line through the array that asynchronously determines the end of precharge of the OR array.

A further object of the present invention is to provide a method for achieving high speed operation and low power consumption of a logic array.

SUMMARY OF THE INVENTION

The above and other objects and advantages of the present invention are achieved by providing a logic array having a first portion and a second portion wherein the first and second portions have a virtual ground. Precharged means are provided for precharging the first and second portions. The end of the precharge cycle is used to controllably couple the virtual ground lines of the first portion to a reference and a delayed signal generated by the precharge signal is used to controllably couple the virtual ground of the second portion to the reference.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
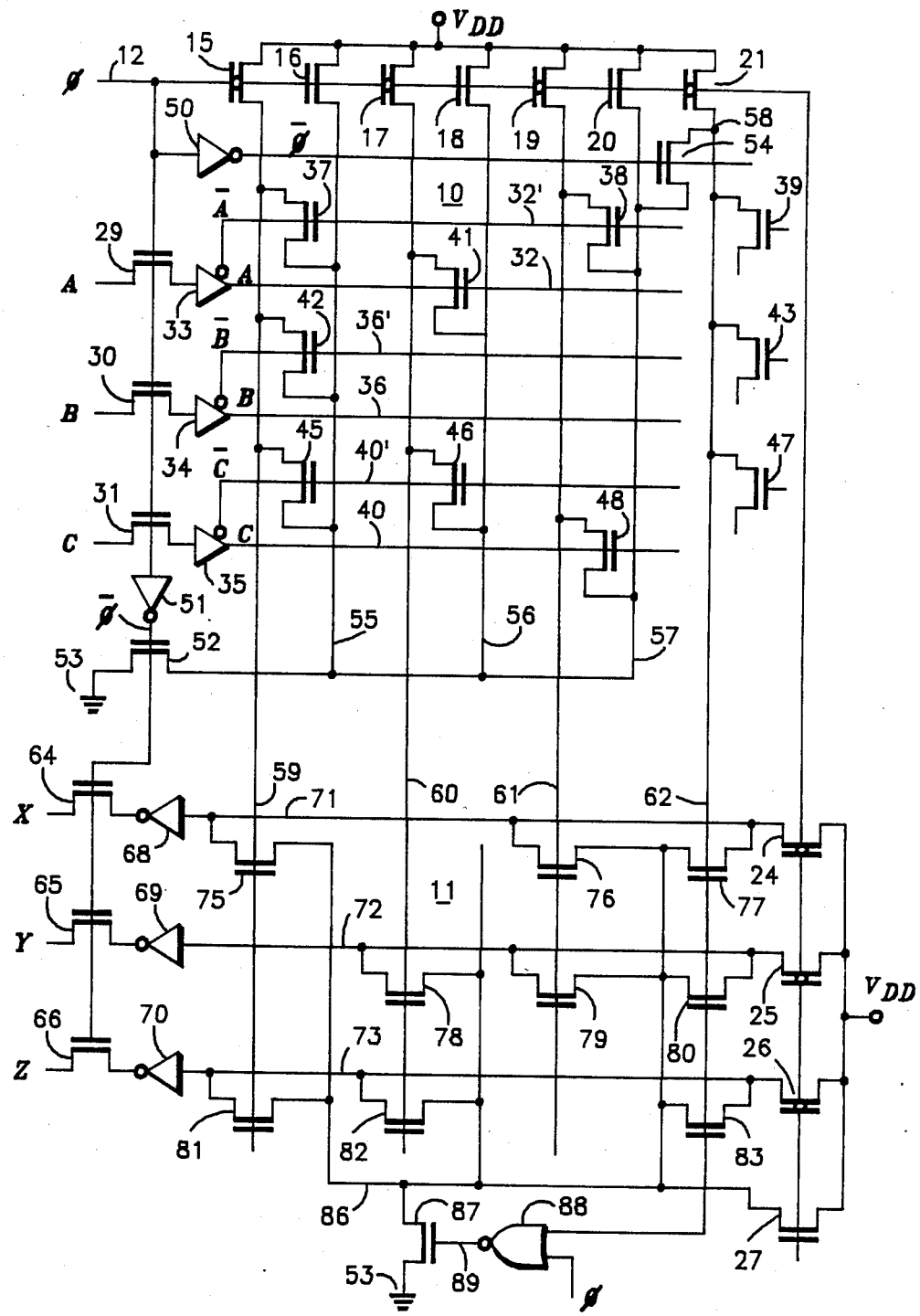
FIG. 1 illustrates in schematic form an abbreviated logic array with one embodiment of the present invention.

A programmable logic array in abbreviated form is illustrated in FIG. 1. A programmable logic array (PLA) is a well known convenient way of using arrays of identical circuit elements to implement arbitrary logical functions in integrated circuits. Accordingly, typically a PLA would have many columns and rows. Only a few of these columns and rows are shown in FIG. 1 for sake of simplicity and are sufficient for an understanding of the present invention.

The PLA has a first portion 10 and a second portion 11. Typically the first portion 10 is called an AND array and the second portion 11 is called an OR array. AND plane or array 10 is shown as having a clock signal input $\phi$ and three address signals A, B, and C. Clock signal $\phi$ serves as a precharge signal which enters on line 12. This control or precharge signal $\phi$ serves to enable load transistors 15 through 21 and 24 through 27. Load transistors 15 through 21 serve as precharge means or devices for the column lines of AND array 10 and load devices 24 through 27 serve as precharge devices for the bit lines of OR array 11. Transistors 15 through 21 each have a drain connected to voltage terminal VDD and a gate connected to line 12. The sources of transistors 15 through 21 are connected to a respective column line such as bit lines 59, 60, and 61; virtual ground lines 55, 56, and 57; and heavily loaded sense/status line 62.

Transistors 15, 17, 19, 21, 24, 25, and 26 are illustrated as natural MOS field effect transistors. A natural transistor has a much lower threshold voltage than does a typical enhanced MOSFET transistor. The other load transistors are illustrated as typical N channel enhancement transistors which in a preferred embodiment have a threshold voltage of approximately one volt. The low threshold natural transistors are used on the bit lines of AND array 10 and OR array 11 so that the bit lines will precharge to a higher voltage level due to the lower threshold voltage. The higher voltage on the bit-lines is desirable since the bit lines of array 10 are connected directly as inputs to the OR array without intervening drivers. Virtual ground lines 55, 56, and 57 of AND array 10 are not precharged by natural transistors since they are not used as drive lines to drive the OR array. In addition, the use of the enhancement transistors results in better overall control of the device operation both functionally and process wise. Note that virtual ground line 86 of OR array 11 is also precharged by an N channel enhancement transistor 27 and not by a natural transistor.

Control or precharge signal $\phi$ is also coupled to inverters 50 and 51. The output of inverter 51 is connected to the gate electrode of transistor 52. Transistor 52 serves to couple virtual ground lines 55, 56, and 57 to a voltage reference terminal 53 illustrated as ground. The output of inverter 50 provides a signal $\bar{\phi}$ which is connected to the gate electrode of transistor 54. Transistor 54 is coupled between node 58 of line 62 and virtual ground line 57 and acts to discharge sense/status line 62 after every precharge. Precharge signal $\bar{\phi}$ also is connected to the gate electrodes of transistors 29, 30, and 31. Transistor 29 couples address signal A to input buffer/inverter 33, transistor 30 couples address input B to input buffer/inverter 34, and transistor 31 couples address input C to input buffer/inverter 35. Buffer/inverter 33 provides an address signal A and an address signal $\bar{A}$ as outputs on row or word lines 32 and 32', respectively. Address signal $\bar{A}$ is connected to the gate electrodes of transistors 37 and 38. Transistor 37 is coupled between bit line 59 and virtual ground line 55. Transistor 38 is coupled between bit line 61 and virtual ground line 57. Those persons skilled in the art will recognize that a transistor could exist between bit line 60 and a virtual ground also, depending upon the desired program contained within AND array 10. The address A output of buffer/inverter 33 is connected to the gate electrode of transistor 41. Transistor 41 is coupled between bit line 60 and virtual ground line 56. Address B output from buffer/inverter 34 on row line 36 is illustrated as not enabling any transistors. Address $\bar{B}$ output of buffer/inverter 34 on row line 36' is shown as enabling the gate electrode of transistor 42. Transistor 42 is coupled between bit line 59 and virtual ground line 55. Address $\bar{C}$ output of buffer/inverter 35 on line 40' is connected to gate electrodes of transistors 45 and 46. Transistor 45 is coupled between bit line 59 and virtual ground line 55. Transistor 46 is coupled between bit line 60 and virtual ground line 56. Address C output of buffer/inverter 35 on line 40 is connected to the gate electrode of transistor 48. Transistor 48 is coupled between bit line 61 and virtual ground line 57. Virtual ground lines 55, 56, 57 are connected to transistor 52 which couples them to reference terminal 53 when transistor 52 is enabled by control signal $\bar{\phi}$ appearing at the output of inverter 51. Transistors 39, 43 and 47 are dummy transistors whose only purpose is to provide loading on sense/status line 62.

Input buffer/inverters 33, 34, and 35 are standard circuits which buffer the input signal from the address input lines and provide the address output as well as a complement of the address. Transistors 29, 30, and 31 in conjunction with buffer/inverters 33, 34, and 35 form a dynamic latch for the address inputs illustrated as inputs A, B, and C. Each time clock or precharge signal $\phi$ goes high, a new set of addresses is allowed to the inputs of inverters 33, 34, and 35.

Control signal $\bar{\phi}$ generated by inverter 51 is also connected to the gate electrodes of transistors 64, 65, and 66. Transistors 64, 65, 66 couple outputs X, Y and Z, respectively, from OR array 11. Bit lines 59, 60, 61 from AND array 10 serve as input lines to OR array 11 and do not require drivers between the AND and OR arrays as do other logic arrays. Input line 59 is connected to gate electrodes of transistors 75 and 81. Transistor 75 is coupled between bit line 71 and line 86, the virtual ground line for OR array 11. Transistor 81 is coupled between bit line 73 and virtual ground line 86. Input line 60 is connected to the gate electrode of transistors 78 and 82. Transistor 78 is coupled between bit line 72 and virtual ground line 86 while transistor 82 is coupled between bit line 73 and virtual ground line 86. Input line 61 is connected to the gate electrodes of transistors 76 and 79. Transistor 76 is coupled between bit line 71 and virtual ground line 86 while transistor 79 is coupled between bit line 72 and virtual ground line 86.

Line 62 is heavily loaded by dummy transistors 39, 43, and 47 in addition to transistors 77, 80, and 83, and serves as a delay means or status/sense line by delaying the time that ground potential applied to the source of transistor 54 is sensed or responded to by NOR gate 88. This ensures that lines 59, 60, and 61 have reached a valid level following precharge before line 62 goes low thereby causing NOR gate 88 to enable transistor 87 so that virtual ground line 86 is coupled to ground terminal 53. Accordingly, it can be said that line 62 is a sense/status line that indicates when the inputs to OR array 11 on lines 59, 60, and 61 are valid. The status/sense operation by line 62 is an asynchronous operation that functions independent of temperature, voltage, or processing variables. Sense/status line 62 enables NOR gate 88 asynchronously since the enabling does not require additional timing or control signals.

Line 62 is connected to the gate of transistors 77, 80, and 83 and to a first input of NOR gate 88. Transistor 77 is coupled between bit line 71 and virtual ground line 86. Transistor 80 is coupled between bit line 72 and virtual ground line 86, and transistor 83 is coupled between bit line 73 and virtual ground line 86. A second input of NOR gate 88 receives clock input $\phi$ and the output of NOR gate 88 is provided on line 89 which is connected to the gate electrode of transistor 87. Transistor 87 is coupled between virtual ground line 86 and voltage reference terminal 53. Bit line 71 is connected to the input of inverter 68, bit line 72 is connected to the input of inverter 69, and bit line 73 is connected to the input of inverter 70. Inverters 68, 69, and 70 act as output buffers for OR array 11 and in conjunction with transistor couplers 64, 65, and 66 act as dynamic output latches to provide outputs X, Y, and Z, respectively.

Figure 2:
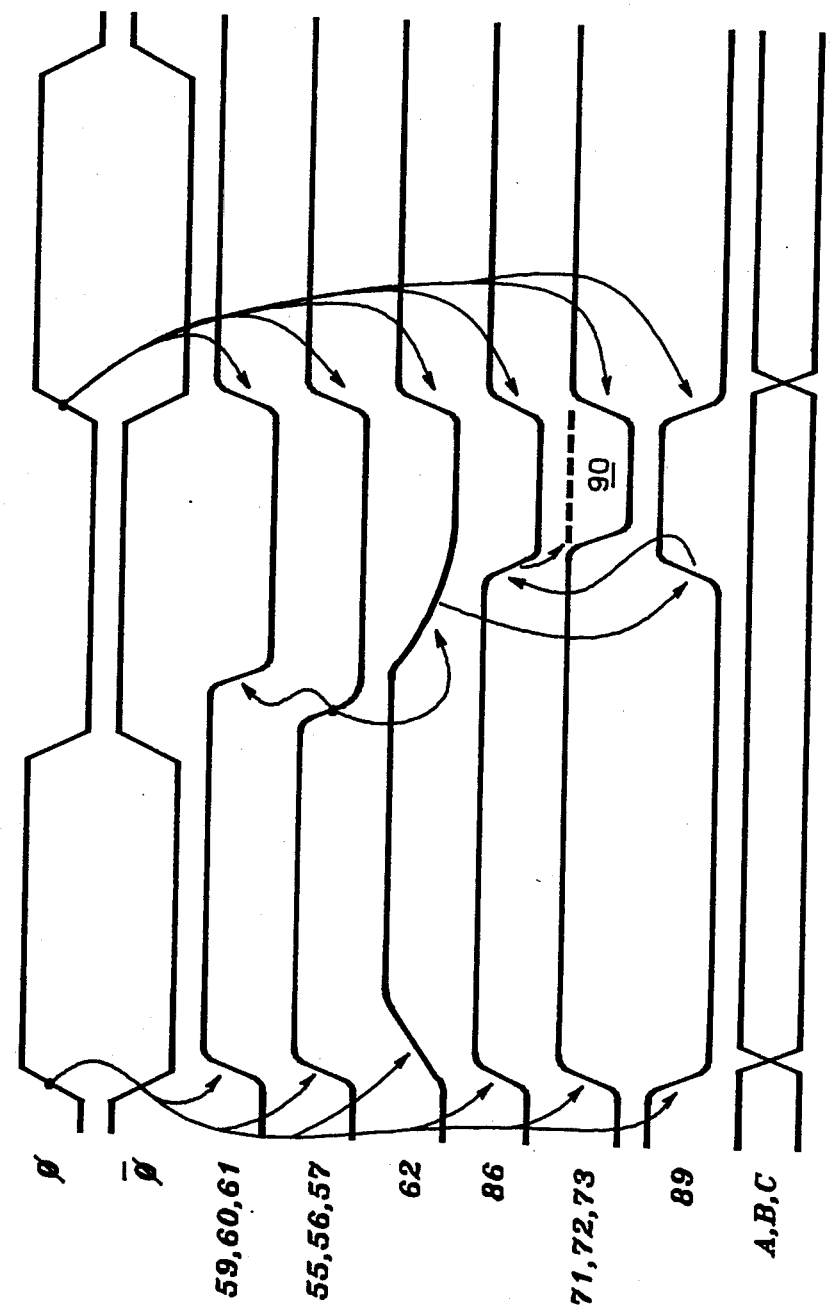
FIG. 2 illustrates some waveforms useful in the understanding of the operation of the logic array of FIG. 1.

The operation of the programmable logic array illustrated in FIG. 1 can be better understood by reference to the waveforms shown in FIG. 2. When precharge signal $\phi$ is applied to line 12, all the precharge transistors 15–21 and 24–27 are enabled thereby precharging the column lines of AND array 10 and the word lines of OR array 11. The bit lines of OR array 11 are also precharged at this time. The waveforms in FIG. 2 have a number at the left which corresponds to the reference numerals used in FIG. 1 and indicate the waveforms presented at those lines or nodes of FIG. 1. As the precharge transistors are enabled, column lines 59, 60, and 61 are precharged to approximately voltage level VDD minus the threshold voltage of the precharge transistor. Virtual ground lines 55, 56, and 57 are also precharged during this time. Node 58 (along with line 62), virtual ground line 86, and the bit lines 71, 72, and 73 are all also precharged. During this time, addresses A, B, and C are coupled to input buffers or row drivers 33, 34, and 35. This allows the addresses to enter AND array 10 and to go to their valid state during precharge of array 10. As precharge signal $\phi$ decreases in amplitude, signal $\bar{\phi}$, as generated by inverters 50 and 51, increases from approximately zero volts to VDD volts in amplitude. Signal $\bar{\phi}$ from inverter 50 enables transistor 54 thereby providing a path from node 58 to virtual ground line 57. Signal $\bar{\phi}$, generated by inverter 51, enables transistor 52 which couples the virtual ground lines 55, 56, and 57 of AND array 10 to voltage reference terminal 53. Node 58 does not discharge rapidly since it is intentionally heavily loaded with loads illustrated as transistors 39, 43, and 47. Line 62 is coupled to the first input of NOR gate 88, and since precharge signal $\phi$ is at a low level, when line 62 becomes low then the output of NOR gate 88, which is illustrated by waveform 89, will go to a logic one level thereby enabling transistor 87 and causing virtual ground line 86 to go low as illustrated by waveform 86. Once virtual ground line 86 goes low, valid data will appear on the bit sense lines of OR array 11 as illustrated by waveform 71. Valid data is illustrated by area 90 of waveform 71 in FIG. 2 and can either be a high level or a low level (dependent upon whether a transistor is unprogrammed or programmed at the row and column intersection respectively).

Since line 62 is heavily loaded it serves as a delay means for the signal at node 58 to be presented to the input of NOR gate 88. Transistors 39, 43, and 47 represent diffusion plugs attached to line 62. Heavily loaded line 62 causes OR array 11 to sense the termination of the precharge cycle at a delayed time from the end of precharge signal $\phi$.

By now it should be appreciated that there has been provided a high speed logic array which can be fully precharged thereby having lower power dissipation. A delay means or sense/status line is provided which is functionally not part of the logic array but geometrically has the same structure as the other lines of the array. This sense line is loaded with dummy transistor loads which act as capacitance to emulate the worst case delay expected in the logic array. The logic array does not require elaborate buffers or inhibitors to implement the precharge function. The complete operation of the circuit including precharge, coupling in of the address signals, and coupling out output data is all accomplished with only one clock signal. In the operation of the array, during precharge, both virtual grounds are floated and the output lines are precharged. The input lines or addresses are coupled into the array and will be stable by the end of the precharge cycle. At the end of the precharge cycle, the ground for the AND array is switched on and the outputs of the AND array which appear on lines 59, 60, and 61 settle down quickly as there are no active load pull ups. At the end of the precharge cycle one end of the sense line 62 which serves as a delay means is pulled down. Since sense line 62 is under worst case load conditions it provides sufficient delay to guarantee that by the time it is low all the outputs of the AND array are stabilized. The low condition on line 62, which delayably enables NOR gate 88, switches on the ground to OR array 11 and the outputs of the OR array settle down quickly as there are no active or enabled pull up devices.

The array of the present invention can be made in smaller size since buffers or drivers are eliminated between the AND array and the OR array, only one control or clock signal is used to perform precharging, and minimal size program devices are used in the array itself. The speed of the array is increased since the inputs to the AND array are allowed to go valid thereby completing the first level of selection during precharging itself.

Although the present invention has been illustrated as having only a first portion (AND array) and a second portion (OR array) it will be recognized that the principles of the invention can be used in an array having more than just two portions.

We claim:

1. A method of percharging and obtaining data from a logic array having a first portion and a second portion, each portion having a plurality of virtual ground lines, comprising:

precharging the plurality of virtual ground lines in each of the first and second portions and substantially simultaneously gating in addresses to the first portion;

coupling the virtual ground lines of the first portion to ground and substantially simultaneously enabling outputs from the first portion; and coupling the virtual ground lines of the second portion to ground when the outputs from the first portion have stabliized.

2. A logic array having a first portion and a second portion, comprising:

the first portion having a first plurality of virtual ground lines;

the second portion having a second plurality of virtual ground lines;

first means for precharging the first plurality of virtual ground lines;

second means for precharging the second plurality of virtual ground lines wherein a single precharge signal enables both the first and second means;

third means for coupling the first plurality of virtual ground lines to ground;

fourth means for coupling the second plurality of virtual ground lines to ground wherein a single control signal enables both the third and fourth means; and delay means coupled to the fourth means and responsive to the control signal for delaying the coupling of the second plurality of virtual ground lines to ground.

3. The logic array of claim 2 wherein the delay means is a heavily loaded line and wherein the control signal is a complement of the precharge signal.

4. The logic array of claim 2 wherein the first portion performs a logical AND function and the second portion performs a logical OR function.

* * * * *